(12) United States Patent
Yan (10) Patent No.: US 8,134,292 B2
(45) Date of Patent: Mar. 13, 2012

(54) LIGHT EMITTING DEVICE WITH A THERMAL INSULATING AND REFRACTIVE INDEX MATCHING MATERIAL

(75) Inventor: Xiantao Yan, San Jose, CA (US)

(73) Assignee: LedEngin, Inc., San Jose, CA (US)

( * ) Notice: Subject to any disclaimer, the term of this patent is extended or adjusted under 35 U.S.C. 154(b) by 327 days.

(21) Appl. No.: 11/036,559

(22) Filed: Jan. 13, 2005

(65) Prior Publication Data

US 2006/0091788 A1    May 4, 2006

Related U.S. Application Data

(60) Provisional application No. 60/623,266, filed on Oct. 29, 2004, provisional application No. 60/623,171, filed on Oct. 29, 2004, provisional application No. 60/623,260, filed on Oct. 29, 2004.

(51) Int. Cl.
 *H01J 1/62* (2006.01)
(52) U.S. Cl. ............ 313/512; 313/506; 313/509
(58) Field of Classification Search ........... 313/498–512
 See application file for complete search history.

(56) References Cited

U.S. PATENT DOCUMENTS

| | | | |
|---|---|---|---|
| 5,742,120 A * | 4/1998 | Lin | 313/512 |
| 5,959,316 A * | 9/1999 | Lowery | 257/98 |
| 6,307,160 B1 | 10/2001 | Mei et al. | |
| 6,351,069 B1 | 2/2002 | Lowery et al. | |
| 6,608,332 B2 | 8/2003 | Shimizu et al. | |
| 6,610,563 B1 | 8/2003 | Waitl et al. | |
| 6,614,179 B1 | 9/2003 | Shimizu et al. | |
| 6,642,652 B2 | 11/2003 | Collins, III et al. | |
| 6,680,128 B2 | 1/2004 | Mei | |
| 6,791,116 B2 | 9/2004 | Takahashi et al. | |
| 6,828,170 B2 | 12/2004 | Roberts et al. | |
| 7,064,353 B2 | 6/2006 | Bhat | |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 2001/0015778 A1 | 8/2001 | Murade | |

(Continued)

FOREIGN PATENT DOCUMENTS

JP    2000-349346    12/2000

(Continued)

OTHER PUBLICATIONS

"Solvent Soluble Polyimide with High Transparency and High Tg: HOP-400, 500", Hitachi Cable Review, Aug. 2003, No. 22, p. 78.

(Continued)

*Primary Examiner* — Bumsuk Won
(74) *Attorney, Agent, or Firm* — Carr & Ferrell LLP (57) ABSTRACT

A light emitting device has a light emitting diode (LED) encapsulated by an encapsulant member. The encapsulant member includes a luminescent material, such as a phosphor, and a thermal insulating material. The thermal insulating material effectively insulates the luminescent material from the heat generated by the LED. A thermal conducting material is desirably placed in thermal contact with a back side of the LED to assist heat dissipation. The encapsulant member may be formed in two separate layers with the luminescent material forming a luminescent layer, and the thermal insulating material forming a thermal insulation layer disposed between the luminescent layer and the LED.

33 Claims, 4 Drawing Sheets

U.S. PATENT DOCUMENTS

| | | | |
|---|---|---|---|
| 2002/0015013 A1* | 2/2002 | Ragle | 345/82 |
| 2002/0079837 A1* | 6/2002 | Okazaki | 313/512 |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1* | 5/2003 | Grenda et al. | 362/30 |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1* | 12/2003 | Epstein | 313/512 |
| 2004/0004437 A1* | 1/2004 | Shimizu et al. | 313/512 |
| 2004/0036081 A1 | 2/2004 | Okazaki | |
| 2004/0051111 A1* | 3/2004 | Ota et al. | 257/98 |
| 2004/0079957 A1 | 4/2004 | Andrews et al. | |
| 2004/0084687 A1 | 5/2004 | Hohn et al. | |
| 2004/0102061 A1 | 5/2004 | Watanabe | |
| 2004/0126918 A1 | 7/2004 | Kurahashi et al. | |
| 2004/0129946 A1 | 7/2004 | Nagai et al. | |
| 2004/0173810 A1 | 9/2004 | Lin et al. | |
| 2004/0188697 A1 | 9/2004 | Brunner et al. | |
| 2004/0201025 A1* | 10/2004 | Barnett et al. | 257/79 |
| 2004/0207998 A1 | 10/2004 | Suehiro et al. | |
| 2004/0257496 A1 | 12/2004 | Sonoda | |
| 2005/0035364 A1 | 2/2005 | Sano et al. | |
| 2005/0093146 A1 | 5/2005 | Sakano | |
| 2005/0145872 A1* | 7/2005 | Fang et al. | 257/103 |
| 2005/0179376 A1* | 8/2005 | Fung et al. | 313/512 |
| 2005/0199900 A1* | 9/2005 | Lin et al. | 257/99 |
| 2005/0221519 A1 | 10/2005 | Leung et al. | |
| 2005/0224829 A1 | 10/2005 | Negley et al. | |
| 2005/0224830 A1* | 10/2005 | Blonder et al. | 257/100 |
| 2005/0253242 A1 | 11/2005 | Costello et al. | |
| 2005/0270666 A1 | 12/2005 | Loh et al. | |
| 2005/0286131 A1* | 12/2005 | Saxena et al. | 359/586 |
| 2006/0012299 A1* | 1/2006 | Suehiro et al. | 313/512 |
| 2006/0063287 A1 | 3/2006 | Andrews | |
| 2006/0082296 A1* | 4/2006 | Chua et al. | 313/512 |
| 2006/0082679 A1 | 4/2006 | Chua et al. | |
| 2006/0097385 A1* | 5/2006 | Negley | 257/722 |
| 2006/0102914 A1* | 5/2006 | Smits et al. | 257/98 |
| 2006/0105484 A1* | 5/2006 | Basin et al. | 438/27 |
| 2006/0105485 A1* | 5/2006 | Basin et al. | 438/27 |
| 2006/0170332 A1 | 8/2006 | Tamaki et al. | |
| 2006/0284209 A1 | 12/2006 | Kim et al. | |
| 2006/0289050 A1 | 12/2006 | Alley et al. | |
| 2007/0090375 A1 | 4/2007 | Kobilke | |
| 2007/0194341 A1 | 8/2007 | Chang et al. | |
| 2007/0215893 A1 | 9/2007 | Liao et al. | |
| 2007/0228390 A1 | 10/2007 | Hattori et al. | |
| 2007/0278512 A1 | 12/2007 | Loh et al. | |
| 2008/0012036 A1 | 1/2008 | Loh et al. | |
| 2008/0048200 A1 | 2/2008 | Mueller et al. | |
| 2008/0308825 A1 | 12/2008 | Chakraborty et al. | |

FOREIGN PATENT DOCUMENTS

| | | |
|---|---|---|
| JP | 2000-349347 | 12/2000 |
| JP | 2001-057445 | 2/2001 |
| JP | 2002185046 | 6/2002 |
| JP | 2004241704 | 8/2004 |
| JP | 2004-253404 | 9/2004 |

OTHER PUBLICATIONS

U.S. Appl. No. 11/259,818, Xiantao Yan, LED Package with Structure and Materials for High Heat Dissipation, filed Oct. 26, 2005.

U.S. Appl. No. 11/260,101, Xiantao Yan, Method of Manufacturing Ceramic LED Packages, filed Oct. 26, 2005.

U.S. Appl. No. 11/259,842, Xiantao Yan, High Power LED Package with Universal Bonding Pads and Interconnect Arrangement, filed Oct. 26, 2005.

Yan, Two Test Specimens for Determining the Interfacial Fracture Toughness in Flip-Chip Assemblies, Transactions of the ASME, vol. 120, Jun. 1998, p. 150.

Yan, Analysis Based Design Guidelines for Metal Runner and Passivation Layers in IC Packaging, Delphi Automotive Systems Analytical Engineering Conference, May 2000, p. 1.

"Thermal conduction in metallized silicon-dioxide layers on silicon", O.W. Kading, H. Skurk, K.E. Goodson, American Institute of Physics, Applied Physics Letter, 65 (13), Sep. 26, 1994, pp. 1629-1631.

U.S. Appl. No. 11/796,240, Xiantao Yan, LED Packages with Mushroom Shaped Lenses and Methods of Manufacturing LED Light-Emitting Devices, filed Apr. 27, 2007.

U.S. Appl. No. 11/824,233, Xiantao Yan, Matrix Material Including an Embedded Dispersion of Beads for a Light-Emitting Device, filed Jun. 29, 2007.

Official Action for Japanese patent application No. 2005-315149, Japan Patent Office, Jul. 21, 2009, pp. 1-3, 1-2.

Harper, Charles A. Electronic Materials and Processes Handbook, 2004, The McGraw-Hill Companies, Third Edition, p. 2.39.

\* cited by examiner

FIG. 7

LIGHT EMITTING DEVICE WITH A THERMAL INSULATING AND REFRACTIVE INDEX MATCHING MATERIAL

CROSS-REFERENCE TO RELATED APPLICATIONS

The present disclosure claims the benefit of U.S. Provisional Patent Application No. 60/623,266 entitled "1-5 Watt and Higher LED Packages," U.S. Provisional Patent Application No. 60/623,171 entitled "3-10 Watt and Higher LED Packages," and U.S. Provisional Patent Application No. 60/623,260 entitled "5-15 Watt and Higher LED Packages," each filed on Oct. 29, 2004 and each incorporated herein by reference in its entirety.

BACKGROUND OF THE INVENTION

1. Field of the Invention

The present invention relates generally to light emitting diodes (LEDs) and more particularly to packages for high-power LEDs.

2. Description of the Prior Art

A light emitting diode (LED) is a semiconductor device that produces light when an electric current is passed therethrough. LEDs have many advantages over other lighting sources including compactness, very low weight, inexpensive and simple manufacturing, freedom from burn-out problems, high vibration resistance, and an ability to endure frequent repetitive operations. In addition to having widespread applications for electronic products as indicator lights and so forth, LEDs also have become an important alternative light source for various applications where incandescent and fluorescent lamps have traditionally predominated.

One improvement that has broadened the applicability of LEDs has been the use of phosphors in conjunction with LEDs. A phosphor is a luminescent material that, when excited by a light of a certain wavelength, produces a light at a different wavelength, thus modifying the output light of the LED. Thus, where a particular color is desired and that color cannot be produced by available LEDs (or cost effective LEDs), phosphors can be used as light "converters" to alter the color of the light produced by an available LED to the desired color.

For example, phosphors are now used with monochromatic LEDs to produce white light. Using phosphors to convert the light produced by an LED to white light has proven to be an excellent alternative to other conventional white light sources, including incandescent light sources and the direct red-green-blue (RGB) LED methods in which multiple monochromatic LEDs are combined in a RGB scheme to produce white light.

In a typical LED-based white light producing device, a monochromatic LED is encapsulated by a transparent material containing appropriate phosphors. In some systems, an LED that produces a monochromatic visible light is encapsulated by a material containing a compensatory phosphor. The wavelength(s) of the light emitted from the compensatory phosphor is compensatory to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is carefully controlled such that only a fraction of the blue light is absorbed by the phosphor while the remainder passes unabsorbed. The yellowish light and the unabsorbed blue light mix to produce white light.

Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

Figure 1:
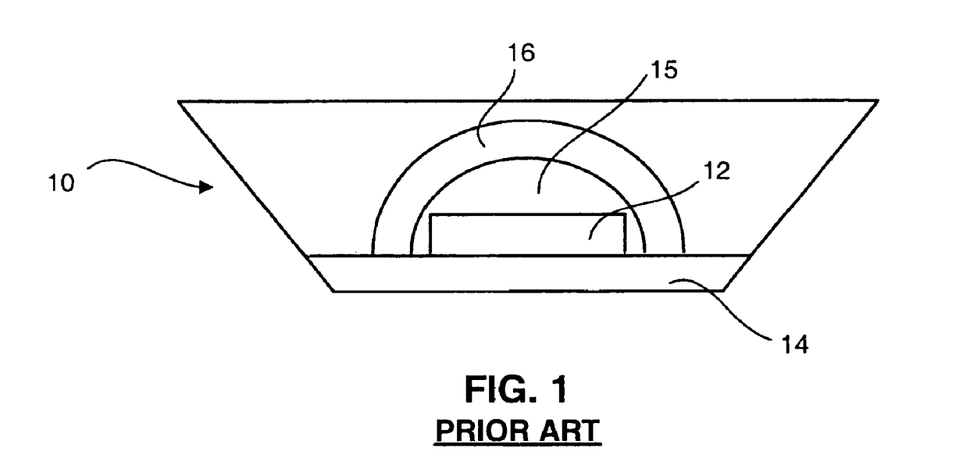
FIG. 1 is a schematic diagram of an LED-based light emitting device according to the prior art.
Figure 2:
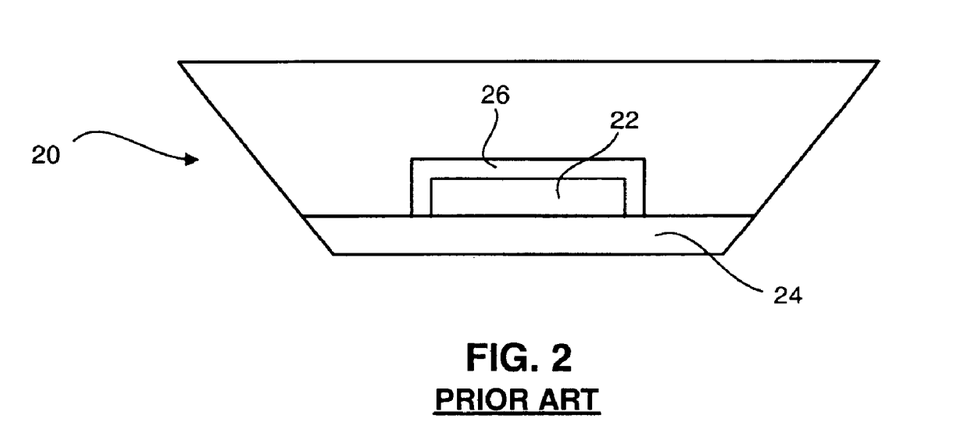
FIG. 2 is a schematic diagram of another LED-based light emitting device according to the prior art.

FIGS. 1 and 2 illustrate two alternative encapsulated light emitting devices that incorporate phosphors according to the prior art. FIG. 1 shows a schematic diagram of a light emitting device 10 having an LED 12 mounted on a substrate 14. The LED 12 is encapsulated by a phosphor-containing layer 16. A generally hemispherical and transparent spacer layer 15 is disposed between the LED 12 and the phosphor-containing layer 16. The spacer layer 15 is formed by dropping a viscous, transparent UV light-cured resin over the LED 12. The spacer layer 15 functions as a filler or spacer to improve the uniformity of the thickness of the phosphor-containing layer 16.

FIG. 2 shows a schematic diagram of another light emitting device 20 having an LED 22 mounted on a substrate 24. The LED 22 is encapsulated by a conformal phosphor-containing layer 26. As opposed to the light emitting device 10, the light emitting device 20 does not use a filler or spacer between the phosphor-containing layer 26 and the LED 22. The uniformity of the thickness of the phosphor-containing layer 26 is achieved instead by using a stenciling technique. Specifically, a patterned stencil is placed over the LED 22, and a curable silicone liquid matrix containing a phosphor material is stenciled on to the LED 22. When cured, the silicone liquid matrix containing the phosphor material forms the phosphor-containing layer 26 on the LED 22.

One problem with LED-based white light sources described above is the poor thermal stability of the phosphors. Specifically, exposure to high temperatures for extended periods tends to alter the chemical and physical properties of such phosphors causing performance deterioration. For instance, the light conversion efficiency can decline and the wavelength of output light can shift, both altering the balance of the light mixture and potentially diminishing the intensity of the overall output. For example, currently available phosphors are often based on oxide or sulfide host lattices including certain rare earth ions. Under prolonged high temperature conditions, these lattices decompose and change their optical behavior.

Other problems commonly found with LED-based white light sources are transient color changes and uneven color distributions, both caused by temperature gradients in the phosphor-containing material. Such behaviors often create an unsatisfactory illumination.

In addition to the issues presented above, a need exists for better light extraction from LED-based white light sources. Specifically, internal reflection at the LED/encapsulant interface prevents a fraction of the light generated inside the LED from escaping and can significantly reduce the light efficiency of the device (Lumens per Watt). The fraction of light prevented from escaping from the LED increases as a function of the difference between the indices of refraction of the materials on either side of the interface. Most semiconductor materials used for fabricating LEDs have refractive indices in the range of 2.5 to 3.5. On the other hand, the refractive indices of commonly used encapsulation materials, such as polymers and epoxies, are in the range of 1.5 to 1.55. In order to increase the light extraction efficiency, a material with a higher refractive index is needed to reduce reflective losses at the interface between the LED and the encapsulant.

Furthermore, high reliability is another requirement for encapsulation materials. Ideally speaking, an encapsulation material should have a coefficient of thermal expansion (CTE) close to that of the LED and the package materials. When this condition is difficult to meet, the elastic modulus of the encapsulation material should be low enough to reduce stresses on wire bonds and the LED.

Recent advances in semiconductor technology have made it possible to manufacture high-power LEDs that produce light with an output power of about 1 watt and above. With such high power outputs, devices incorporating such LEDs can run very hot. The above-mentioned thermal problems worsen with increasing temperature and therefore are particularly severe for devices that incorporate high-power LEDs with phosphors. Presently, the above-mentioned thermal problems have severely limited the allowable LED temperature to only about 125° C. and have limited the allowable thermal resistance of prior art lighting systems.

Given the importance of LEDs as light sources, particularly high-power LEDs, there is a need for improved LED packaging methods and materials to alleviate the above-identified problems by providing better heat resistance, higher light extraction efficiencies and higher reliabilities. Such packaging methods and materials will allow for devices with smaller packages and higher luminosities, which are critical for light source applications.

SUMMARY

The present disclosure addresses the above problems by providing a light emitting device comprising a light emitting diode (LED) and an encapsulant member covering on the top surface the light emitting diode, where the encapsulant member includes a luminescent material and a thermal insulating material. The thermally insulating material also can be an optical refractive index matching material. In some embodiments, the encapsutlant member includes a luminescent layer comprising the luminescent material and a thermal insulation layer comprising the thermal insulation material. In these embodiments the thermal insulation layer is disposed between the luminescent layer and the top surface of the LED.

Various materials, including polymers, ceramics and glasses, can be used as the thermal insulating material. In one embodiment, the thermal insulating material is a polyimide. In another embodiment, the thermal insulating is a solvent-soluble thermoplastic polyimide. In some embodiments, the thermal insulating material has a thermal conductivity no more than 0.5 W/m° K. In some embodiments, the thermal insulating material has a thermal conductivity no more than 0.15 W/m° K. In some embodiments, the thermal insulating material has a glass transition temperature above 200° C. In some embodiments, the thermal insulating material has a refractive index greater than 1.3. In other embodiments, the thermal insulating material has a refractive index in a range of 1.5-2.0 for improved index matching. In some embodiments, the thermal insulating material has a coefficient of thermal expansion no greater than 100 ppm/° C. In other embodiments, the thermal insulating material has a coefficient of thermal expansion no greater than 30 ppm/° C. The thermal insulating material is desirably transparent to a wavelength of light emitted by the LED.

The present invention is suitable for packaging a broad range of LEDs made by different manufacturers for different applications. The luminescent material may be any suitable material including the following phosphors, yttrium aluminum garnet (YAG), terbium aluminum garnet (TAG), zinc selenium sulfide (ZnSeS+), and silicon aluminum oxynitride (SiAlON).

In some embodiments, a thermal conducting material is placed in thermal contact with a back side of the LED for efficient heat dissipation. In one embodiment, the thermal conducting material is a ceramic, such as aluminum nitrite (AlN) or aluminum oxide ($Al_2O_3$). The thickness of the thermal conducting material may be optimized for optimum heat conduction.

The light emitting device of the present disclosure is suitable for various applications. It is particularly suitable as a light source using a high-power LED, including a white light source using a blue LED or a UV LED. In one embodiment, the light emitting device is capable of producing a power about 1 watt or higher. In another embodiment, the light emitting device is capable of producing a power about 15 watts or higher. In some embodiments, the light emitting device includes more than one LED packaged together for producing a higher power.

The use of a thermal insulating material reduces heat conduction from the LED to the phosphor and thus protects the phosphor from thermal degradation. Furthermore, choosing a thermal insulating material that has a higher refractive index also results in a closer match between the refractive index of the thermal insulating material and the refractive index of the LED materials. This helps to increase the light generating efficiency of the light emitting device.

DETAILED DESCRIPTION OF THE DISCLOSURE

The present disclosure provides a light emitting device using a light emitting diode (LED) and a phosphor thermally insulated from the LED. Those skilled in the art will recognize that various features disclosed in connection with the embodiments may be used either individually or jointly. It is to be appreciated that while the present inventions have been described with reference to preferred implementations, those having ordinary skill in the art will recognize that the present inventions may be beneficially utilized in any number of environments and implementations.

Figure 3:
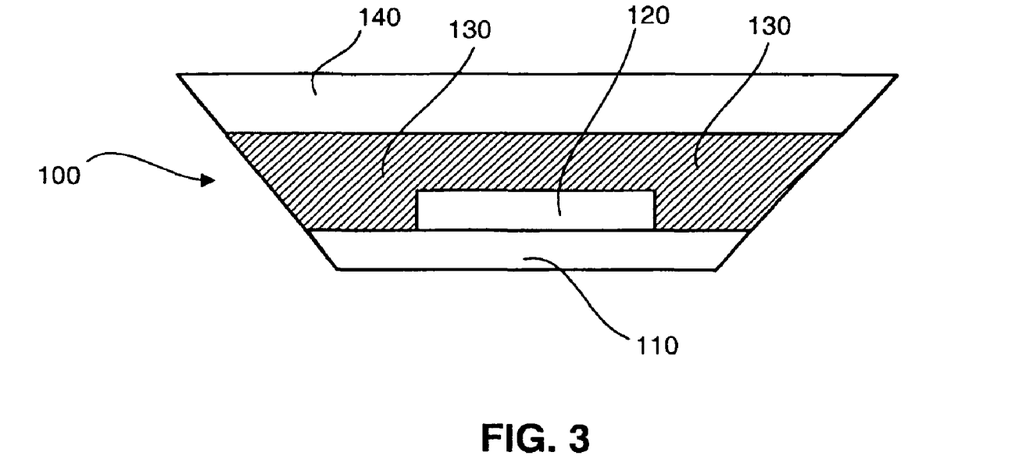
FIG. 3 is a schematic diagram of an LED-based light emitting device according to an embodiment of the present invention.

FIG. 3 is a schematic diagram of a light emitting device 100 in accordance with an embodiment of the present invention. From bottom to top, the light emitting device 100 comprises a substrate 110, an LED 120 having a bottom side mounted to the substrate 110, an encapsulant member 130 disposed over a top surface of the LED 120, and an optional auxiliary member 140 disposed over the encapsulant member 130, all placed within a cavity with tapered sidewalls so that the cavity is shaped like an inverted cone. The auxiliary member 140 is optional and can be, for example, an optical lens for focusing the light emitted from the device 100. The auxiliary member 140 can also serve as a protective capping layer.

It will be appreciated that certain features have been omitted from FIG. 3 for clarity. For example, the sidewalls of the cavity and the substrate 110 are part of a larger package that provide electrical connections (not shown) to the LED 120. In some embodiments, the cavity is defined into an existing material to form the sidewalls and the substrate 110. In other embodiments, as described in more detail below, the substrate 110 is a discrete layer, and the cavity is defined into one or more layers bonded above the substrate 110.

The encapsulant member 130 includes a luminescent material, such as a phosphor material, and a thermal insulating material. The thermal insulating material at least partially protects the luminescent material from the heat produced by the LED 120, thus better maintaining thermal properties, such as light conversion efficiency and output wavelength, at or near optimal values far longer than under the prior art. As discussed below, the thermal insulating material can also be an index matching material.

The light emitting device 100 of FIG. 3 illustrates the basic concept of using a thermal insulating material to protect the luminescent material within the encapsulant member 130 from the heat produced by the LED 120, and to improve the light extraction efficiency. It will be appreciated that prior art light emitting devices (FIGS. 1 and 2) do not include thermal insulation to protect phosphors from the heat generated by the LEDs because heat dissipation has been an overriding concern in such devices. Put another way, designers of prior art light emitting devices have sought to dissipate as much heat as possible through the phosphor-containing layers 16, 26 because to do otherwise would require too much heat dissipation through the remainder of the light emitting device.

The focus in the prior art has therefore been on increasing the heat conduction properties of the phosphor-containing layers 16, 26 and the spacer layer 15, when present, due to the limited heat conduction properties of the remainder of these structures. However, where the substrate 110 provides sufficient heat conduction, it is no longer necessary to conduct heat through the phosphor-containing layers 16, 26, and, as in the present invention, thermal insulation can be introduced to shield the luminescent materials. The present invention describes examples of such enabling substrates, but it will be appreciated that the invention is not limited to any particular substrate design or material.

Returning to FIG. 3, in some embodiments the phosphor material is mixed into the thermal insulating material to form a composite, and this composite forms the encapsulant member 130. For example, because many commonly used phosphor materials are supplied as particles or granules, these particles can simply be mixed or dispersed into a thermal insulating material to form a matrix. While the encapsulant member 130 formed from this matrix provides better thermal protection for those phosphor particles located further from the LED 120 than closer, for some applications this can be sufficient. In other embodiments, as illustrated below, the encapsulant member 130 comprises discrete layers of the thermal insulating material and the luminescent material.

Figure 4:
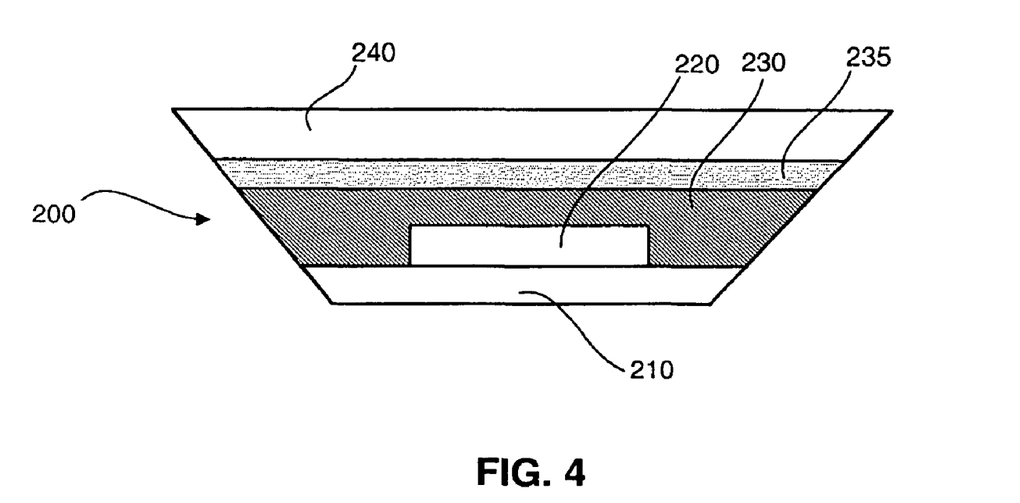
FIG. 4 is a schematic diagram of an LED-based light emitting device according to another embodiment of the present invention.

FIG. 4 is a schematic diagram of a light emitting device 200 in accordance with another embodiment of the present invention. From bottom to top, the light emitting device 200 includes a substrate 210, an LED 220, a thermal insulation layer 230, a luminescent layer 235, and an auxiliary member 240, all placed in a tapered cavity having the shape of an inverted cone. Compared to the light emitting device 100 of FIG. 3, the encapsulant member in the light emitting device 200 comprises two separate layers, the luminescent layer 235, including a luminescent material, and the thermal insulation layer 230 formed from a thermal insulating material. The thermal insulation layer 230 is disposed between the luminescent layer 235 and top surface of the LED 220.

The embodiment shown in FIG. 4 provides at least two additional benefits as compared to the embodiment of FIG. 3. First, because the thermal insulation layer 230 and the luminescent layer 235 are separately formed, the thermal insulating material need not have suitable properties to serve as a host for the phosphor material, and likewise the phosphor material does not have to be compatible with the thermal insulating material. This broadens the range of materials that can be selected for both the thermal insulating material and the phosphor material. Second, because the luminescent layer 235 is discretely separated from the LED 220 by the thermal insulation layer 230, the thermal protection provided to the luminescent layer 235 is more complete and uniform across the luminescent layer 235.

The luminescent layer 235 is desirably conformally disposed over an outer surface of the thermal insulation layer 230. This helps to form a uniform thickness of the luminescent layer 235. The luminescent layer 235 can be bonded directly to the thermal insulation layer 230, or can be bonded to the thermal insulation layer 230 with a bonding agent such as an adhesive.

The thermal insulation layer 230 is preferably transparent, or nearly so, to the light emitted from the LED 220. The thermal insulating material is therefore preferably transparent to at least one wavelength emitted by the LED 220. The wavelengths emitted by various available LEDs extend over a wide spectrum, including both visible and invisible light, depending on the type of the LED. The wavelengths of common LEDs is generally in a range of about 200 nm-2000 nm, namely from the infrared to the ultraviolet.

In order to effectively thermally insulate the luminescent layer 235, the thermal insulating material of the thermal insulation layer 230 should have a low thermal conductivity, desirably with a thermal conductivity of no more than 0.5 watts per meter per degree Kelvin (W/m° K), and more desirably with a thermal conductivity of no more than 0.15 W/m° K. The thermal insulating material for the thermal insulation layer 230 desirably also has high heat resistance, preferably with a glass transition temperature, $T_g$, above 170° C., and more preferably a glass transition temperature above 250° C. Furthermore, in order to have good thermal compatibility and mechanical compatibility between the thermal insulation layer 230 and other components, especially the LED 220 and the substrate 210, which are typically semiconductor materials, the thermal insulating material desirably has a coefficient of thermal expansion no greater than 100 ppm/° C., and more desirably a coefficient of thermal expansion no greater than 30 ppm/° C.

Furthermore, in order to reduce total internal reflection, the thermal insulating material in the thermal insulation layer 230 should desirably have a refractive index that is similar to the refractive index of the material in the layer of the LED 220 that adjoins the thermal insulation layer 230. Total internal reflection is one of the important factors that affect the efficiency of an LED. Due to total internal reflection, light that impinges upon the interface between the LED 220 and the thermal insulation layer 230 can be totally reflected internally within the LED 220 if the angle of incidence is larger than a critical angle determined by Snell's law. According to Snell's law, the critical angle decreases as the difference between the refractive indexes of two adjoining materials increases. Accordingly, efficiency increases as the critical angle increases as the difference in refractive indexes is minimized. To reduce total internal reflection and therefore increase the efficiency of the LED 220, the thermal insulating material desirably has a refractive index greater than 1.6, and more desirably greater than 1.8, and still more desirably greater than 2.0. In some embodiments, the thermal insulating material has a refractive index in a range of 1.5-2.1.

Any material that meets the above requirements can be used as the thermal insulating material for the thermal insulation layer 230 in accordance with the present disclosure. The thermal insulating material can comprise polymers, ceramics, glasses, mixtures thereof, as well as other suitable materials. Particular examples are the high-optical-quality polyimide materials supplied by Brewer Science, Inc. and Hitachi Chemical Co., Ltd. Among these commercially available high transparency polyimide materials, OptiNDEX B38 (Brewer Science) and PIQ 2200 (Hitachi Chemical) are particularly suitable to be used as the thermal insulating material in this invention. OptiNDEX B38 and PIQ 2200 are curable liquids. After being cured, the liquid OptiNDEX B38 or PIQ 2200 forms a film of satisfactory properties for the present invention and can be used to form the thermal insulation layer 230 of the present invention. Some typical properties for these polyimide materials are listed in TABLE 1.

TABLE 1

| | |
|---|---|
| Thermal Decomposition Temperature (1% loss) | 490° C. |
| Glass Transition Temperature ($T_g$) | 250° C. |
| Coefficient of Thermal Expansion (CTE) | 66 ppm/° C. |
| Transmittance (400 nm at 8 μm) | 70~95% |
| Refractive index (at 400 nm–800 nm) | 1.65~1.84 |
| Dielectric constant | 3.4 |

Curing conditions recommended by the manufacturers can be used to cure OptiNDEX B38 and PIQ 2200. Typical conditions involve spin coating followed by curing by baking in a furnace under $N_2$. For better adhesion to the surface on which the PIQ 2200 is applied, an adhesion promoter is preferably used. The adhesion promoter is applied as a coating to the surface of the LED 220, the adhesion promoter is then baked, and then the PIQ 2200 polyimide is applied over the adhesion promoter, pre-baked using a hot plate contact, and finally post-baked in a $N_2$ furnace. One particularly suitable adhesion promoter is PIQ-Coupler 3 supplied by Hitachi Chemical Co., Ltd. Similarly, adhesion promoter APX-K1 is suitable for OptiNDEX B38.

As noted above, in some embodiments the thermal insulating material can be applied by spin-coating. Spin coating is desirable when manufacturing on the wafer level as opposed to manufacturing devices individually. When applying the thermal insulating material by spin coating, the thermal insulating material can be deposited with a thickness in the range of 4 to 40 micrometers. After further processing the individual devices are obtained by a wafer singulation process.

It will be appreciated that many of the properties listed above for the thermal insulating material of the thermal insulation layer 230 also apply to the matrix used to suspend the luminescent material in the luminescent layer 235 or in the encapsulant member 130. Accordingly, the matrix material desirably has high transparency at the relevant wavelengths and an index or refraction closely matched to that of the thermal insulation layer 230, when present, or to the layer of the LED 120 in contact with the encapsulant member 130 otherwise. Obviously, the matrix material does not need to have a low thermal conductivity when used in the luminescent layer 235, but will need the low thermal conductivity when used in the encapsulant member 130 without the thermal insulation layer 230. Similar reasoning extends to the glass transition temperature.

The present invention can be used for making a light emitting device using any existing LED and luminescent material. In one embodiment, the present invention provides a light source capable of producing white light based on a monochromatic LED. This can be done, for example, by using a visible light LED and a compensatory phosphor, or by using an invisible light LED together with RGB phosphors. For instance, a widely used blue LED-based white light source produces white light using a blue light LED and a phosphor producing a yellowish light upon partially absorbing the blue light, as described above in the Background of the Invention section.

Luminescent materials suitable for the present invention include both fluorescent materials (phosphors) and phosphorescent materials. Phosphors are particularly useful for LED-based white light sources. Common phosphors for these purposes include Yttrium Aluminum Garnet (YAG) materials, Terbium Aluminum Garnet (TAG) materials, ZnSeS+ materials, and Silicon Aluminum Oxynitride (SiAlON) materials (such as α-SiAlON).

The present invention can be combined with various methods for LED packaging, including the prior art methods for improving the uniformity of the thickness of the phosphor layer, described above with respect to FIGS. 1 and 2. Generally speaking, the encapsulant member 130 can replace layers 15 and 16 in FIG. 1 and layer 26 in FIG. 2. More specifically, with respect to FIG. 1, the thermal insulation layer 230 and the luminescent layer 235 can replace layers 15 and 16, respectively, so that the thermal insulation layer 230 is formed in the shape of a hemispherical cap and the luminescent layer 235 conforms thereto. Similarly, with respect to FIG. 2, the thermal insulation layer 230 can replace the phosphor-containing layer 26 and the luminescent layer 235 can be formed over the thermal insulation layer 230.

Particularly, the concept of using a thermal insulation to protect phosphors from LED-generated heat, according to the present invention, can be combined with the LED packages described in U.S. Provisional Patent Application Nos. 60/623,266, 60/623,171, and 60/623,260, listed above in the Cross-Reference to Related Applications section, to make high-power LED light sources. As described below with reference to FIGS. 5-7, LED light sources producing a power about 1 watt or higher can be achieved. In some embodiments, the LED light source can produce a power about 5 watts or higher, about 10 watts or higher, and even about 15 watts or higher.

Figure 5:
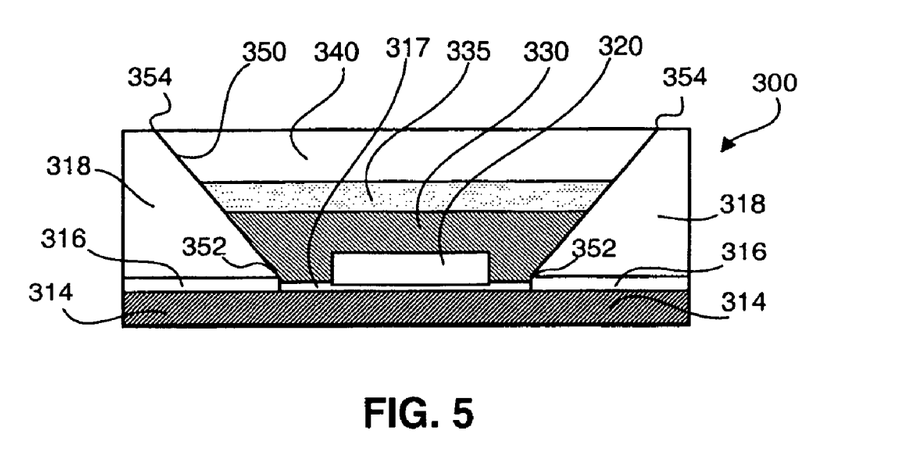
FIG. 5 is a cross-sectional view of an LED-based light emitting device according to an embodiment of the present invention.
Figure 6:
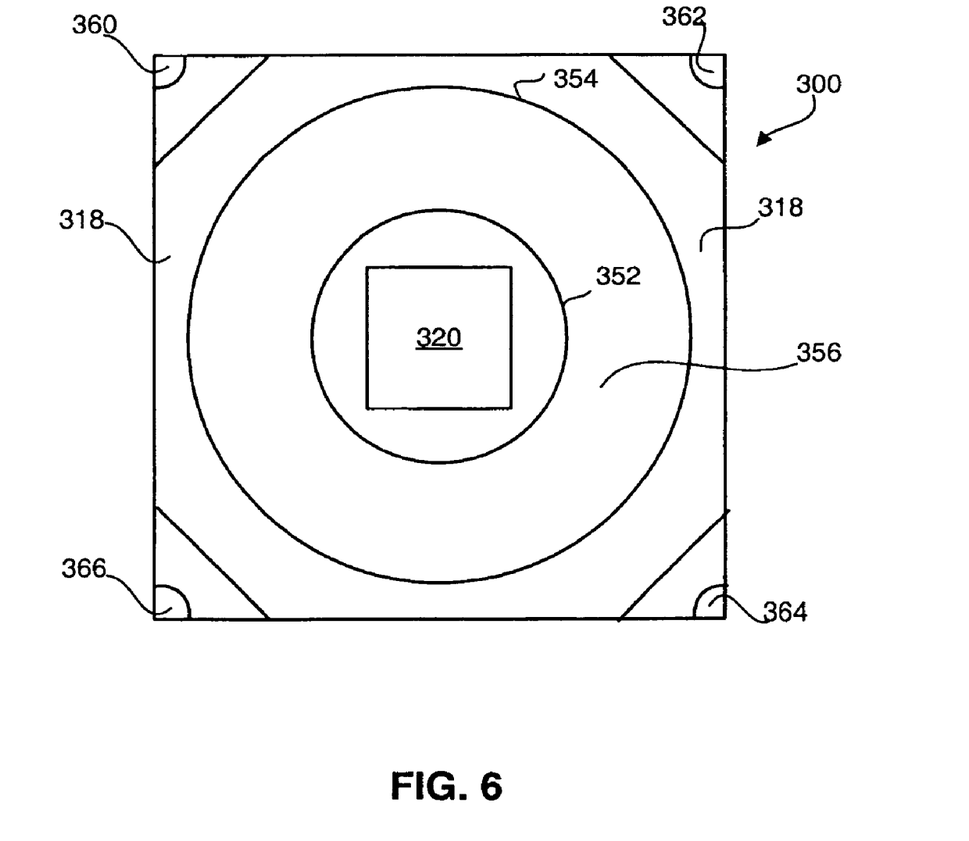
FIG. 6 is a top view of an LED-based light emitting device according to an embodiment of the present invention.

FIGS. 5-6 are cross-sectional and top views, respectively, of an exemplary light emitting device 300 in accordance with an embodiment of the present invention. It can be seen from the cross-section in FIG. 5 that the body of the package comprises three layers designated from bottom to top, a thermal conduction layer 314, an intermediate body layer 316, and a top body layer 318. The thermal conduction layer 314, the intermediate body layer 316, and the top body layer 318 together form a body with a square lateral cross-section (see FIG. 6) and a cavity extending upward from a bottom rim 352 (corresponding to an inner diameter) to a top rim 354 (corresponding to an outer diameter) in the shape of a tapered inverted cone. It can be seen that the cavity extends through the intermediate and top body layers 316, 318. The other components, including an LED 320, a thermal insulation layer 330 a luminescent layer 335, and an optional auxiliary member 340 are contained in the cavity.

With reference to FIG. 5, it can be seen that a bonding layer 317 bonds the LED 320 to a top surface of the thermal conduction layer 314. The thickness of the intermediate body layer 316 is designed to be approximately the same as the thickness of the bonding layer 317. The bonding layer 317 can comprise, for example, an electrically conductive epoxy, a solder, a thermally conductive and electrically non-conductive epoxy, or a nano-carbon-fiber filled adhesive.

This embodiment also includes a partial via (360, 362, 364 and 366) at each of the four corners of the package. In some embodiments multiple light emitting devices 300 are fabricated side-by-side in square arrays and each partial via 360, 362, 364 and 366 is one quarter of a vertical hole formed between four adjacent light emitting devices 300. The inner walls of the vertical holes are metallized using plating or other suitable methods. The metallization of the partial vias 360, 362, 364 and 366 serves as electric connections. In these embodiments, when individual light emitting devices 300 are separated from each other, the vertical holes become the partial vias 360, 362, 364 and 366 on each individual light emitting device 300.

In the embodiment of FIG. 5, a sidewall 350 of the cavity is inclined at a 45° angle. Preferably, the sidewall 350 has a reflective coating, such as a metallization 356 (FIG. 6), that is highly reflective at a wavelength emitted by the LED 320. An exemplary reflective coating is silver, though other materials can be used, depending on the wavelength of the light produced by the LED 320. The sidewall 350 serves to redirect light emitted from the edges of the LED 320. The light from the edges of the LED 320 is redirected in a direction perpendicular to the top surface of the LED 320 so that the light emitted from the sides of the LED 320 adds to the light emitted from the top surface of the LED 320. In other embodiments the sidewall 350 takes a parabolic shape to better focus the redirected light.

The thermal conduction layer 314 provides substantial advantages for dissipating heat from high-power LEDs so that the thermal insulation layer 330 can be employed without causing the light emitting device 300 to overheat. The thermal conduction layer 314 is disposed adjacent to a back side of the LED 320 to efficiently dissipate the heat generated by the LED 320. The thermal conduction layer 314 is made of a thermal conducting material as described below. This design makes the light emitting device 300 particularly suitable for high power LEDs that generate a large amount of heat during operation.

In order for the thermal conduction layer 314 to effectively dissipate heat, the thermal conducting material used for making the thermal conduction layer 314 preferably should have a thermal conductivity greater than about 200 W/m° K. The thermal conducting material desirably should also have suitable thermal and mechanical properties, such as coefficient of thermal expansion and elastic modulus. These properties should desirably be compatible with that of the other components in the light emitting device 300, particularly the semiconductor materials of the LED 320.

In a preferred embodiment, the thermal conduction layer 314 is composed of an aluminum nitrite (AlN) ceramic. In one embodiment, the thermal conduction layer 314, the intermediate body layer 316, and the top body layer 318 are each composed of AlN ceramic. AlN is desirable because it provides high thermal conductivity and has a coefficient of thermal expansion that is close to that of the LED material. However, in other embodiments, aluminum oxide ($Al_2O_3$) can also be used for these layers. In some embodiments, the thermal conduction layer 314 is made from either AlN or $Al_2O_3$, while the intermediate body layer 316 and the top body layer 318 are made of other suitable materials including plastics and metals such as copper, aluminum, Cu/W and alloy 42.

In those embodiments in which all three layers are ceramic, the layers can be manufactured separately, stacked together, and co-fired (sintered) to bond the layers together. When non-ceramic materials are used for the intermediate body layer 316 and the top body layer 318, however, the layers can be bonded together with suitable adhesives.

It will be appreciated that heat produced by the LED 320 is transmitted from the package of the light emitting device 300 primarily through the thermal conduction layer 314 to a heat sink (not shown). Consequently, the thermal conduction layer 314 preferably has a thickness that is optimized for thermal conductivity therethrough. It has been found that the efficiency of thermal dissipation decreases if the thermal conduction layer 314 is either too thin or too thick and, accordingly, there is an optimal thickness for optimal thermal conductivity. This is because heat is dissipated by two mechanisms, in-plane heat spreading and heat transference though the plane. In the embodiment in which the thermal conduction layer 314 is composed of aluminum nitrite (AlN), the estimated optimal thickness is in a range of 0.2 mm-0.4 mm. In one particular embodiment, the thickness is approximately 0.3 mm.

Figure 7:
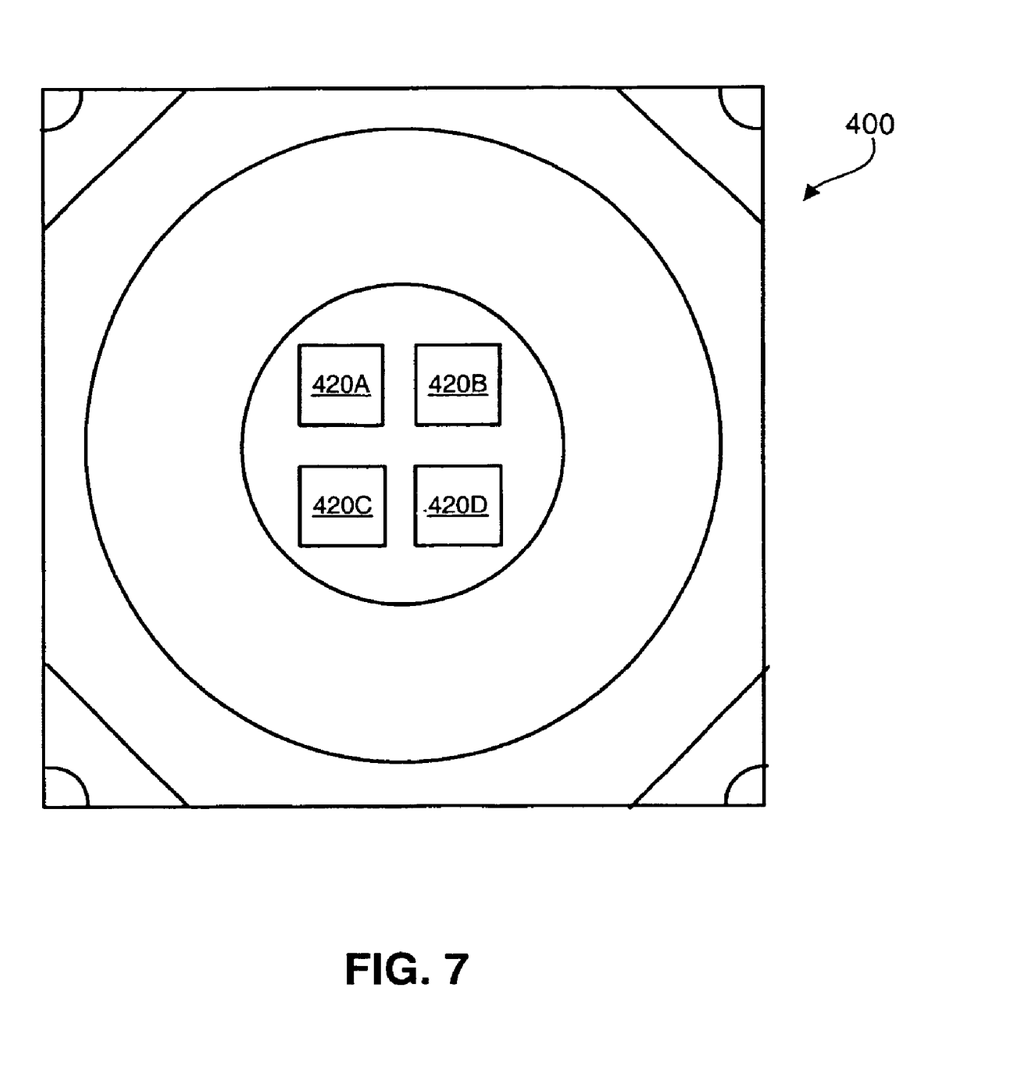
FIG. 7 is a top view of an LED-based light emitting device according to another embodiment of the present invention.

FIG. 7 is a top view of a light emitting device 400 in accordance with another embodiment of the present invention. The light emitting device 400 is similar to the light-emitting device 300 in FIG. 6, except that the light emitting device 400 contains multiple LEDs instead of a single LED. In the particular embodiment shown in FIG. 7, the light emitting device 400 includes four LEDs 420A, 420B, 420C and 420D. These four LEDs can be the same or different, and in some embodiments are operable independently.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:
1. A light emitting device comprising:
a light emitting diode having a top surface; and
an encapsulant member covering the top surface of the light emitting diode, the encapsulant member including a luminescent layer and a thermal insulation layer,
the luminescent layer including a luminescent material separated from the light emitting diode by the thermal insulation layer,
the thermal insulation layer formed from a thermal insulating material and not including luminescent material, the thermal insulation layer material configured to prevent heat from being transferred from the light emitting diode to the luminescent layer,
the thermal insulation layer having an index of refraction of at least 1.6.

2. The light emitting device of claim 1 wherein the luminescent layer is conformally disposed over an outer surface of the thermal insulation layer.

3. The light emitting device of claim 1 wherein the thermal insulating material is transparent to a wavelength emitted by the light emitting diode.

4. The light emitting device of claim 1 wherein the thermal insulating material is transparent to a wavelength in a range of about 200 nm-2000 nm.

5. The light emitting device of claim 1 wherein the thermal insulating material comprises a polymer.

6. The light emitting device of claim 1 wherein the thermal insulating material comprises a polyimide.

7. The light emitting device of claim 1 wherein the thermal insulating material comprises a ceramic.

8. The light emitting device of claim 1 wherein the thermal insulating material comprises a glass.

9. The light emitting device of claim 1 wherein the thermal insulating material has a thermal conductivity of no more than 0.5 W/m° K.

10. The light emitting device of claim 1 wherein the thermal insulating material has a thermal conductivity of no more than 0.15 W/m° K.

11. The light emitting device of claim 1 wherein the thermal insulating material has a glass transition temperature above 200 ° C.

12. The light emitting device of claim 1 wherein the thermal insulating material has a glass transition temperature above 250 ° C.

13. The light emitting device of claim 1 wherein the thermal insulating material has a refractive index greater than 1.8.

14. The light emitting device of claim 1 wherein the thermal insulating material has a refractive index in a range of 1.7-2.1.

15. The light emitting device of claim 1 wherein the thermal insulating material has a coefficient of thermal expansion no greater than 100 ppm/° C.

16. The light emitting device of claim 1 wherein the thermal insulating material has a coefficient of thermal expansion no greater than 30 ppm/° C.

17. The light emitting device of claim 1 wherein the light emitting diode is capable of producing an output power of about 1 watt or higher.

18. The light emitting device of claim 1 wherein the light emitting diode is capable of producing an output power of about 5 watts or higher.

19. The light emitting device of claim 1 wherein the light emitting diode is capable of producing an output power of about 10 watts or higher.

20. The light emitting device of claim 1 wherein the light emitting diode is capable of producing an output power of about 15 watts or higher.

21. The light emitting device of claim 1 wherein the light emitting diode is capable of producing a blue light.

22. The light emitting device of claim 21 wherein the luminescent material produces a white light when excited by the blue light.

23. The light emitting device of claim 1 wherein the luminescent material includes a phosphor.

24. The light emitting device of claim 1 wherein the luminescent material includes an yttrium aluminum garnet material.

25. The light emitting device of claim 1 wherein the luminescent material includes a terbium aluminum garnet material.

26. The light emitting device of claim 1 wherein the luminescent material includes a ZnSeS+material.

27. The light emitting device of claim 1 wherein the luminescent material includes a silicon aluminum oxynitride material.

28. The light emitting device of claim 1 further comprising one or more additional light emitting diodes.

29. The light emitting device of claim 1 further comprising:
a thermal conducting material layer in direct thermal contact with a back side of the light emitting diode, the thermal conducting material layer being electrically non-conducting and having a thermal conductivity greater than 200 W/m° K.

30. The light emitting device of claim 29 wherein the thermal conducting material layer includes a ceramic.

31. The light emitting device of claim 29 wherein the thermal conducting material layer has a thickness in a range of 0.2mm-0.4mm.

32. The light emitting device of claim 29 wherein the thermal conducting material layer includes aluminum nitride.

33. The light emitting device of claim 29 wherein the thermal conducting material layer includes aluminum oxide.

* * * * *